US006921700B2

(12) United States Patent
Orlowski et al.

(10) Patent No.: US 6,921,700 B2
(45) Date of Patent: Jul. 26, 2005

(54) METHOD OF FORMING A TRANSISTOR HAVING MULTIPLE CHANNELS

(75) Inventors: Marius K. Orlowski, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 10/631,093

(22) Filed: Jul. 31, 2003

(65) Prior Publication Data

US 2005/0023619 A1 Feb. 3, 2005

(51) Int. Cl.$^7$ ............................................. H01L 21/336
(52) U.S. Cl. ..................... 438/283; 438/284; 257/331
(58) Field of Search .................... 438/137, 138, 438/142, 149, 157, 193, 195, 201, 212, 270, 283, 284, 479, 517, 587, 588; 257/250, 331, 347, 401

(56) References Cited

U.S. PATENT DOCUMENTS

| | | | |
|---|---|---|---|
| 4,859,623 A | | 8/1989 | Busta |
| 5,223,724 A | * | 6/1993 | Green, Jr. .................... 257/194 |
| 5,266,506 A | * | 11/1993 | Green, Jr. .................... 438/172 |
| 5,689,127 A | | 11/1997 | Chu et al. |
| 6,300,182 B1 | | 10/2001 | Yu |
| 6,365,465 B1 | | 4/2002 | Chan et al. |
| 6,372,559 B1 | | 4/2002 | Crowder et al. |
| 6,413,802 B1 | | 7/2002 | Hu et al. |
| 2002/0185655 A1 | * | 12/2002 | Fahimulla et al. .......... 257/192 |
| 2003/0151077 A1 | * | 8/2003 | Mathew et al. ............. 257/250 |

FOREIGN PATENT DOCUMENTS

WO    WO00/21118    4/2000

OTHER PUBLICATIONS

Monfray, S. et al; "50nm–Gate All Around (GAA)–Silicon On Nothing (SON)–Devices; A Simple Way To Co–Integration of GAA Transistors Within Bulk MOSFET Process"; 2002 Technology; Symposium on VLSI Technology; 2002; pp 108–109; 2002 Symposium on VLSI Technology Digest of Technical Papers.

Monfray, S. et al.; "Highly–Performant 38nm SON (Silicon–On–Nothing) P–MOSFETs with 9nm–thick Channels"; 2002 IEEE International SOI Conference; Oct. 2002; pp. 20–22.

Monfray, S. et al.; " SON (Silicon–On–Nothing) P–MOS-FETs with Totally Silicided (CoSi$_2$) Polysilicon on 5nm–thick Si Films: The Simplest Way to Integration of Metal Gates on Thin FD Channels"IEDM; 2002; pp 263–266; IEEE.

Yu, Bin et al; "FinFet Scaling to 10nm Gate Length"; IEDM; 2002; pp 251–254; IEEE.

(Continued)

Primary Examiner—Olik Chaudhuri
Assistant Examiner—B. V. Keshavan
(74) Attorney, Agent, or Firm—Robert L. King

(57) ABSTRACT

A transistor (10) overlies a substrate (12) and has a plurality of overlying channels (72, 74, 76) that are formed in a stacked arrangement. A continuous gate (60) material surrounds each of the channels. Each of the channels is coupled to source and drain electrodes (S/D) to provide increased channel surface area in a same area that a single channel structure is conventionally implemented. A vertical channel dimension between two regions of the gate (60) are controlled by a growth process as opposed to lithographical or spacer formation techniques. The gate is adjacent all sides of the multiple overlying channels. Each channel is formed by growth from a common seed layer and the source and drain electrodes and the channels are formed of a substantially homogenous crystal lattice.

13 Claims, 6 Drawing Sheets

OTHER PUBLICATIONS

Kedzierski, Jakub et al.; "High_Performance Symmetric-Gate and CMOS-Compatible V, Asymmetric-Gate FinFET Devices"; IEEE; 2001; 4 pp.

Choi, Y. et al.; "Sub-20nm CMOS FinFET Technologies"; IEDM; 2001; pp. 19.1.1-19.1.4; IEEE.

Kim, K. et al.; "Double-Gate CMOS: Symmetrical-Versus Asymmetrical-Gate Devices"; IEEE Transactions on Electron Devices; Feb., 2001; pp 294-299; vol. 48, No. 2; IEEE.

Monfray, S. et al.; "First 80nm SON (Silicon-On-Nothing) MOSFETs With PErfect Morphology and High Electrical Performance"; IEDM; 2001; pp. 29.7.1-29.7.4; IEEE.

Hisamoto, D. et al.; "FinFET-A-Self-Aligned Double-Gate (MOSFET) Scalable to 20nm"; IEEE Transactions of Electron Devices; Dec. 2000; pp 2320-2325; vol. 47, No. 12; IEEE.

* cited by examiner

METHOD OF FORMING A TRANSISTOR HAVING MULTIPLE CHANNELS

RELATED APPLICATION

This application is related to U.S. patent application Ser. No. 10/074,732, entitled "Method of Forming A Vertical Double Gate Semiconductor Device And Structure Thereof" filed Feb. 13, 2002, and assigned to the assignee hereof.

FIELD OF THE INVENTION

This invention relates generally to semiconductors, and more specifically, to the manufacture of and the structure of semiconductor devices.

BACKGROUND OF THE INVENTION

As semiconductor devices continue to become smaller in size, the devices must be what is known in the industry as "scalable". That is, the devices must continue to be able to be made with reduced dimensions and still function at the required specifications. Traditionally, MOSFETs have been implemented with a single control electrode or gate on a planar substrate. The gate is placed between a source and drain electrode and functioned to create a channel for controlling the amount of current conducted by the MOSFET. Because there is a gate electrode to control the channel only on one side of the channel, there is only a single source of control of the channel. Single control of the channel leads to undesired leakage current (i.e. electron or hole flow) between the source and drain when the transistor is intended to be non-conductive.

An improved structure that was proposed was the use of a two-gate transistor with the gates on both sides of a thin silicon channel. This arrangement increases the electrostatic coupling between the gates and the channel relative to the single gate device. As a result, the drive current of the transistor is increased and the leakage current is decreased. One type of transistor having two gates is known in the art as double gate or dual gate FinFETs, in which the channel consists of a single pillar or slab (a fin) that is oriented perpendicular to the plane of a substrate for a given area overlying the substrate. Additional channel width for a transistor requires additional circuit area to provide the additional channel width. For example, known planar MOSFETs and FINFETs having multiple channels are formed laterally and thus require significant additional area.

The effective channel width of a FinFET transistor is only on the surface of a single silicon fin. The dimensions of the fin determine the characteristics of the device. It is desirable that the fin be thinner than the gate length in order to get good short channel control. However, lithographically or spacer defined dimensions do not offer as much manufacturing control as grown layers to form a transistor channel.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
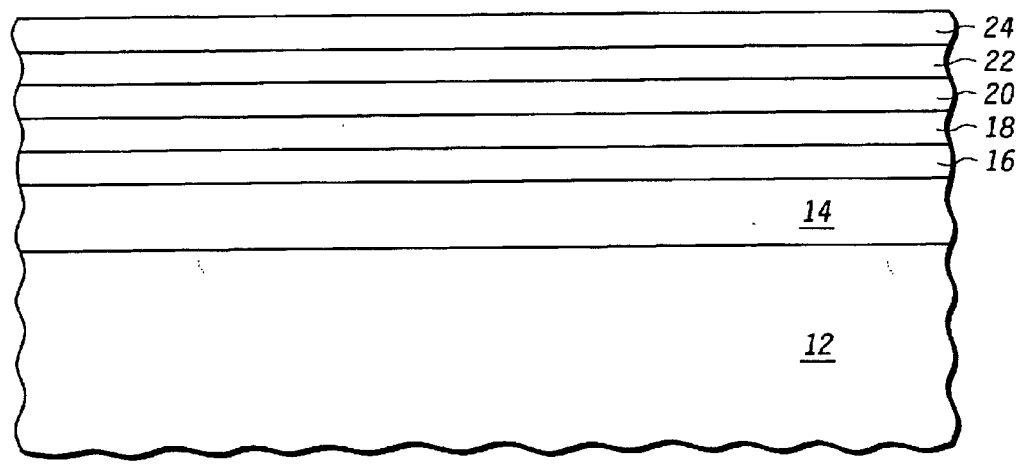
FIG. 1 illustrates in cross-sectional form initial layers of a semiconductor device in accordance with the present invention.

Illustrated in FIG. 1 is a semiconductor device 10 having a substrate 12. In one form the semiconductor device 10 is an FET (field effect transistor). The substrate 12 may be formed of any type of material, either conductive, semiconductive or insulative. In one form, substrate 12 is single crystal silicon. Other forms of substrate 12 may include silicon, silicon on insulator, silicon on sapphire, and silicon on nitride. An insulating layer 14 overlies the substrate 12. Insulating layer 14, in one form, is silicon dioxide. Overlying the insulating layer 14 is a semiconductor layer 16. In one form, semiconductor layer 16 is silicon or silicon germanium, but other semiconductor materials may be used. For example, germanium, silicon germanium carbon, gallium arsenide, gallium nitride and indium phosphide are other appropriate material compositions.

In another form, the integrated circuit substrate 12 is a silicon-on-insulator (SOI) bonded wafer having a silicon layer which functions as semiconductor layer 16. Overlying semiconductor layer 16 is a semiconductor layer 18. While semiconductor layer 18 may be formed of any semiconductor material, one implementation of semiconductor layer 18 is silicon germanium. In addition, semiconductor layer 18 should be of the same crystallinity as the material used for semiconductor layer 16 but having differing etch properties (i.e. different etch rates). A plurality of additional overlying semiconductor layers is formed overlying semiconductor layer 18. In the illustrated form, semiconductor layer 20, semiconductor layer 22 and semiconductor layer 24 are formed. While various materials may be implemented, semiconductor layers 16, 20 and 24 should be formed of the same material in order to have a same first etch rate. Similarly, semiconductor layers 18 and 22 should be formed of the same material in order to have a same second etch rate. Typically, substrate 12, insulating layer 14 and semiconductor layer 16 are formed as an SOI starting material. The creation thereof may be vary. For example, insulating layer 14 may be thermally grown or deposited onto substrate 12 and bonded with semiconductor layer 16. In one form, semiconductor layers 18, 20, 22 and 24 are formed by epitaxial growth. In other forms, semiconductor layers 18, 20, 22 and 24 may be formed using atomic layer deposition or molecular beam epitaxy. The compositions of silicon and silicon germanium and thicknesses thereof are controlled by the ambient gas flow, temperature and time in a conventional manner such as epitaxial growth. Typical thickness for these layers varies between two hundred to four hundred Angstroms. The illustrated thickness is not necessarily drawn to scale.

Figure 2:
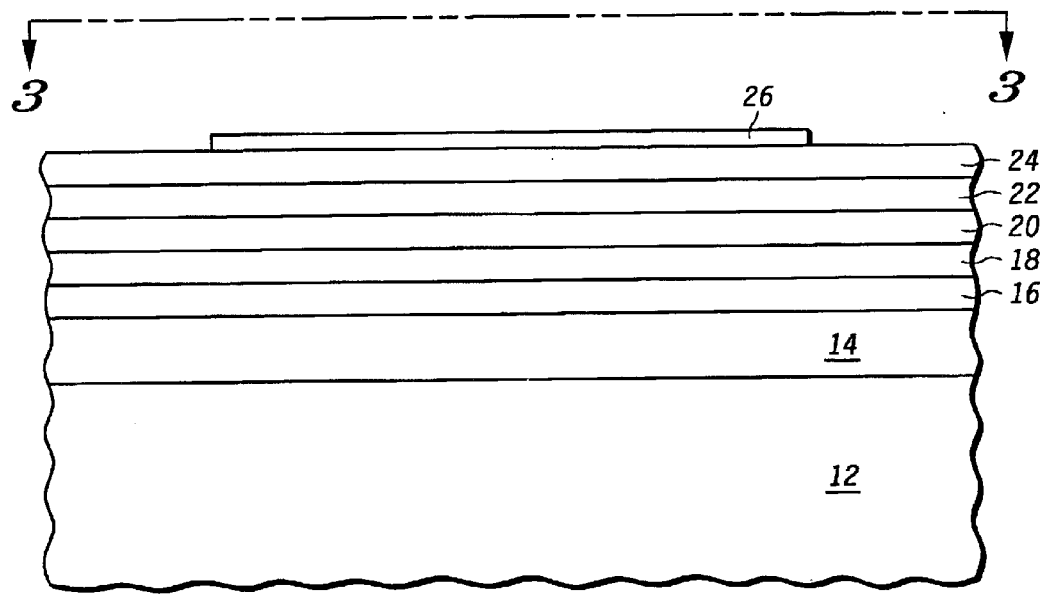
FIG. 2 illustrates in cross-sectional form further processing of the semiconductor device of FIG. 1.

Illustrated in FIG. 2 is further processing of semiconductor device 10 wherein a patterned layer 26 is formed over a predetermined portion of semiconductor layer 24. In one form, the patterned layer 26 is nitride. However, other materials that function as a protective barrier material may be used. Examples of other materials suitable for use as the patterned layer 26 include, by way of example only, photoresist, oxide, and an organic anti-reflective coating (ARC).

Figure 3:
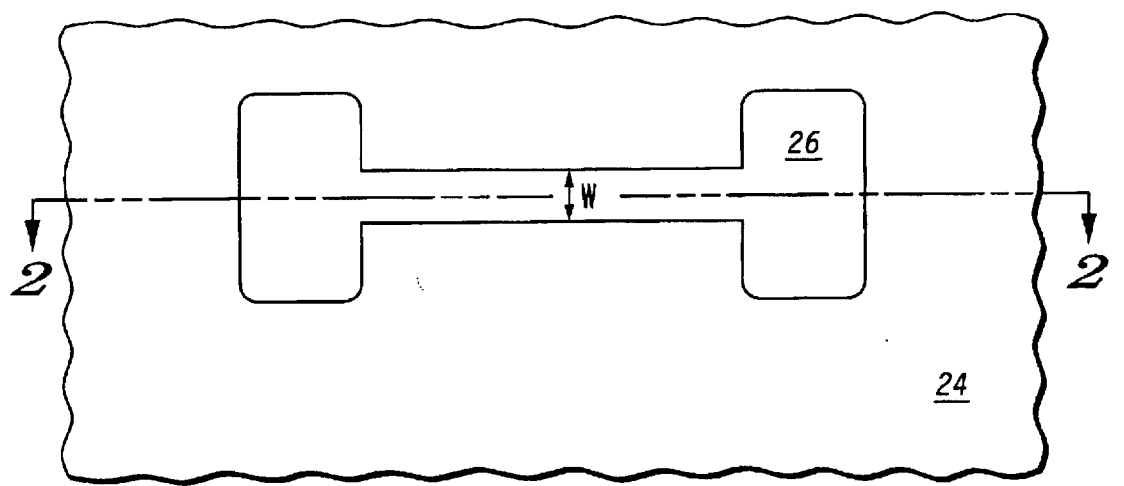
FIG. 3 illustrates in cross-sectional form a top view of the semiconductor device of FIG.2.

Illustrated in FIG. 3 is a top view of the semiconductor device 10 formed as in FIG. 2. From the top, patterned layer 26 has two end portions that are much wider than a connecting portion. The connecting portion forms a channel region and the two ends respectively form a source and a drain that respectively function as first and second current handling terminals, current handling electrodes or current electrodes. The source and drain are not doped (i.e. implanted) until later steps after formation of the gate of the semiconductor device. The width of the channel region is designated as "w". Patterned layer 26 is formed over semiconductor layer 24. Patterned layer 26 functions as a protective barrier to permit selective etching of the underlying semiconductor layers. To further correlate FIG. 3 with FIG. 2, a cross-sectional line in FIG. 3 illustrates the FIG. 2 view.

Figure 4:
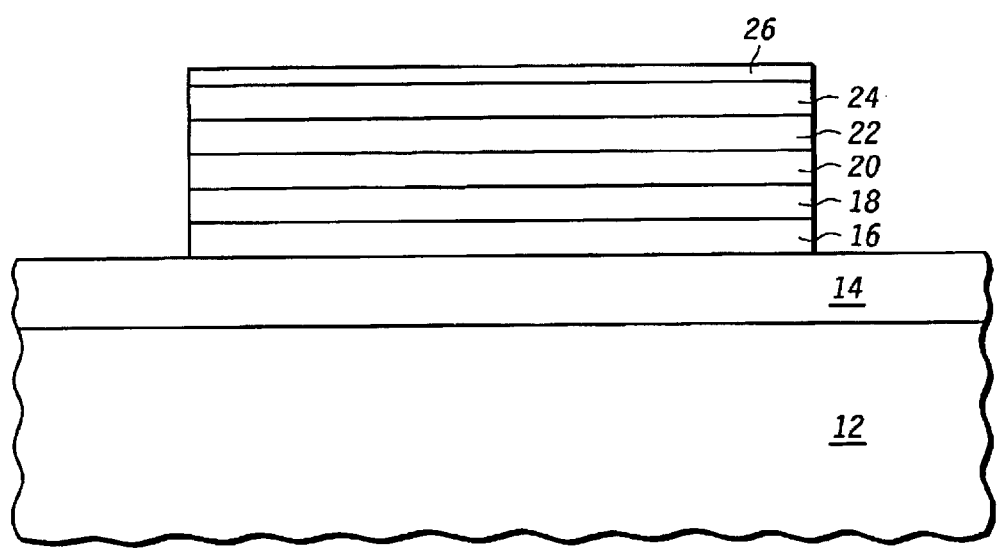
FIG. 4 illustrates in cross-sectional form patterning of the semiconductor device of FIG. 2.

Illustrated in FIG. 4 is further processing of semiconductor device 10. As illustrated, the semiconductor layers 16, 18, 20, 22 and 24 are etched or removed from those areas not protected by the patterned layer 26. The resulting structure exposes insulating layer 14 and leaves a stack of semiconductor layers in which alternating layers are, in one form, a same material with a same etch rate property. Instead of using a same material in alternating layers, the alternating layers have a different etch rate. Semiconductor layers 16, 20 and 24 have etch rates that differ from semiconductor layers 18 and 22. Another way of stating this property is to consider the layers beginning with semiconductor layers 16 and 18 as being odd and even layers, alternately, and so on as additional semiconductor layers are added. Semiconductor layers in odd numbered layers need only to have a different etch rate property than the layers in even numbered layers.

Figure 5:
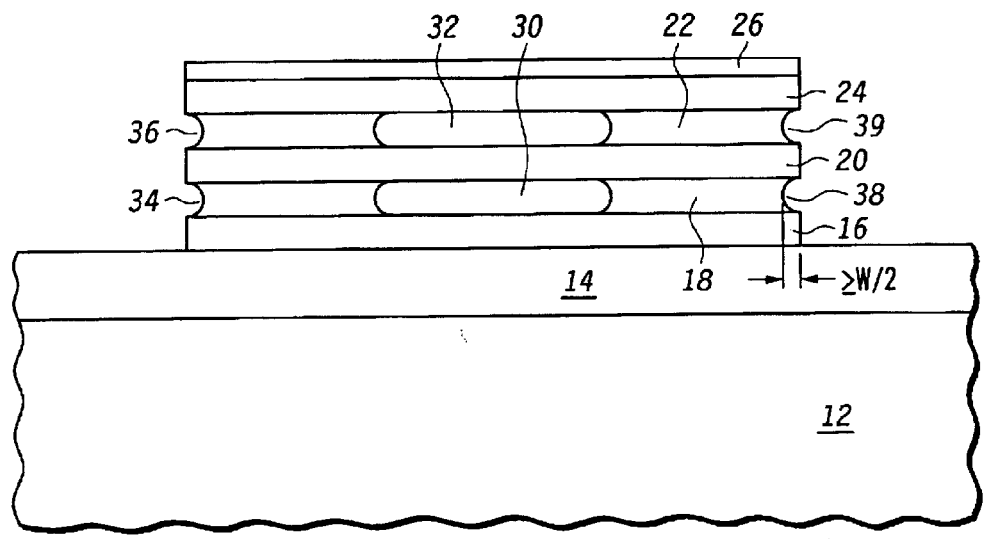
FIG. 5 illustrates in cross-sectional form a first form of processing of the semiconductor device of FIG. 4.

Illustrated in FIG. 5 is further processing of semiconductor device 10 wherein an isotropic etch is performed by placing all of the semiconductor device 10 in an etchant that is selective to etching semiconductor layers 18 and 22. In one form, the etchant is a mixture of nitric acid, hydrogen peroxide and hydrofluoric acid. It should be understood that in another form the etching could be implemented by using an etchant that is selective to semiconductor layers 16, 20 and 24. Referring back to FIG. 3, the varying widths of patterned layer 26 directly influences how the FIG. 5 semiconductor device 10 looks. All exposed surfaces of semiconductor layers 18 and 22 are etched to some extent. The central region of patterned layer 26 has a width, w, that is significantly smaller than the end regions thereof. The smaller width central region allows the complete removal of semiconducting material in a central region of each of semiconductor layers 18 and 22 to respectively form cavities 30 and 32, respectively. Additional to cavities 30 and 32, the remaining exposed portions of semiconductor layers 18 and 22 are also etched. At the edges, complete removal of the semiconductor layers 18 and 22 forms notches 34, 36, 38 and 39. Because the etch that is performed created cavities 30 and 32, it is certain that the amount of inward isotropic etching that occurs at the edges of semiconductor layers 18 and 22 is a length of at least w or greater.

Figure 6:
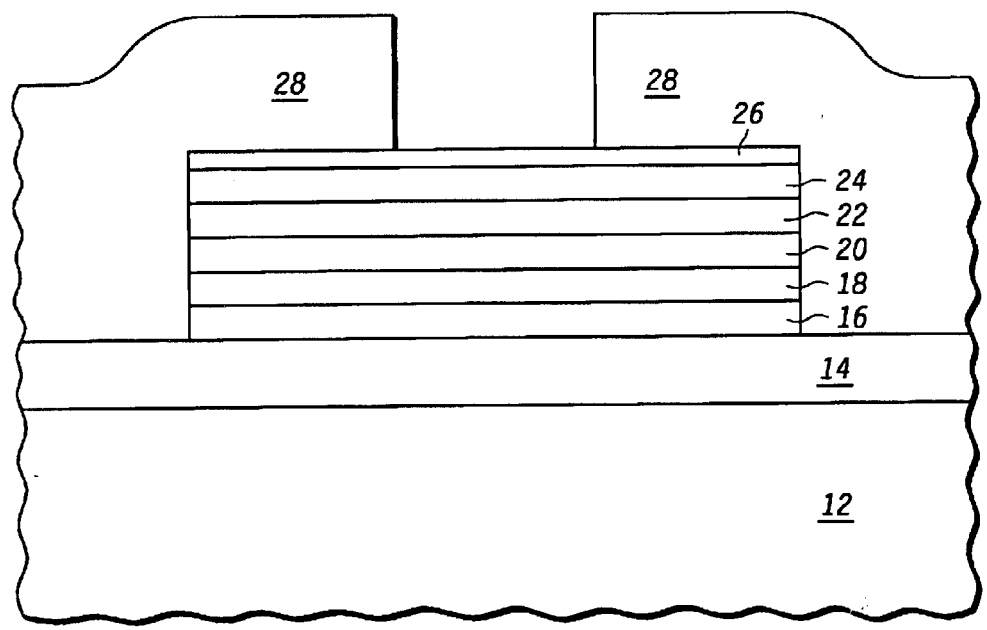
FIGS. 6 and 7 illustrate in cross-sectional form an alternate form of processing of the semiconductor device of FIG. 4.

Illustrated in FIG. 6 is an alternative embodiment of the patterned etch of semiconductor layers 18 and 22. In this form, an extra processing step is required by the presence of notches 34, 36, 38 and 39 is avoided. A protective layer 28 is patterned overlying semiconductor device 10. In particular, only a portion of the stack of semiconductor layers is allowed to be exposed. This exposed area will form the channel region of the semiconductor device 10. In one form the protective layer 28 is implemented with silicon dioxide or a photoresist. Other materials may be used such as a nitride.

Figure 7:
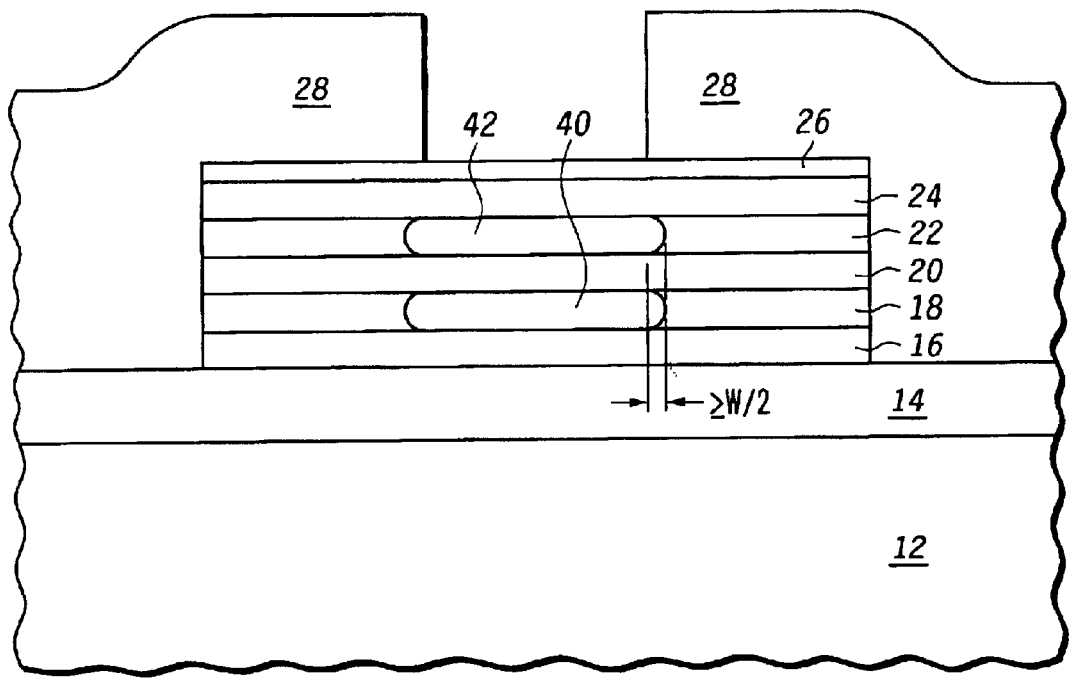

Illustrated in FIG. 7 is a later step in the alternative embodiment begun in FIG. 6. An isotropic is performed by placing all of the semiconductor device 10 in an etchant that is selective to etching semiconductor layers 18 and 22. It should be understood that in another form the etching could be implemented by using an etchant that is selective to semiconductor layers 16, 20 and 24. All exposed surfaces of semiconductor layers 18 and 22 are etched to some extent. The sides of semiconductor layers 18 and 22 directly underneath the opening in protective layer 28 are exposed and etched all the way through to respectively form cavities 40 and 42, respectively. Because the etch goes completely through the width, w, of the central portion of patterned layer 26, the amount of inward isotropic etching that occurs at the edges of cavities 40 and 42 into semiconductor layers 18 and 22, respectively, is a lateral amount of at least one-half of w (w/2) or greater since the etching of cavities 40 and 42 is occurring from two sides. It should however be apparent that due to effects such as loading, non-uniform etch rates between the central region and the edge regions are possible thereby resulting in the edge etch dimension being slightly less than (w/2). To conclude the selective etching of semiconductor layers 18 and 22, the protective layer 28 is removed.

Figure 8:
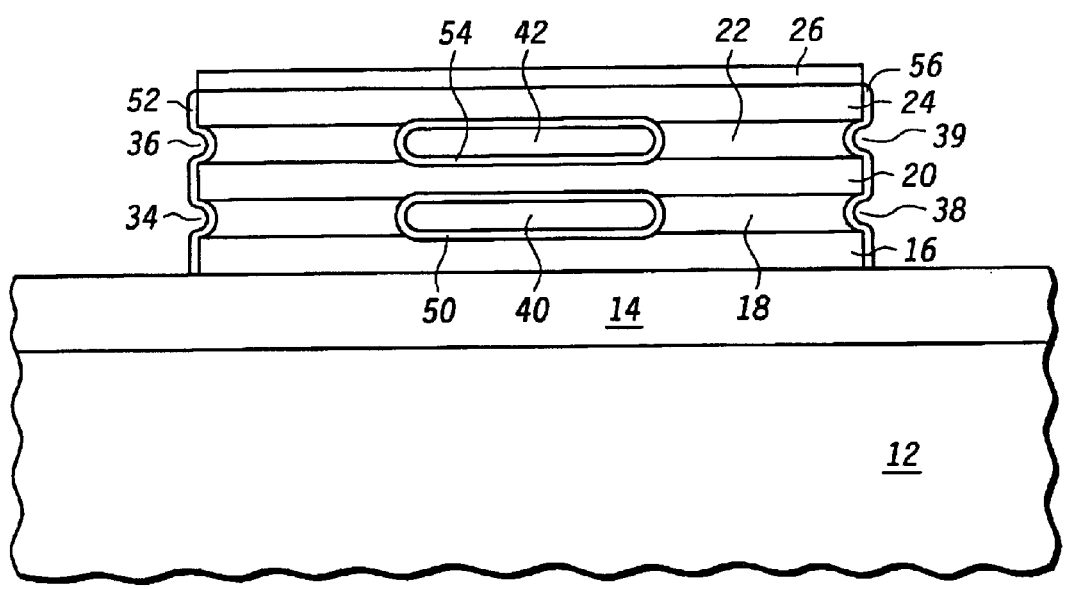
FIG. 8 illustrates in cross-sectional form continuation of the processing of the semiconductor device of FIG. 5.

Assume that the first form of the etching of semiconductor layers 18 and 22 is implemented for discussion of further processing. Illustrated in FIG. 8 is the resulting structure from FIG. 5. In FIG. 8, a thin dielectric or insulating layer is formed on all exposed surfaces of the semiconductor layers 16, 18, 20 22 and 24. In particular, thin oxide layers 50 and 52 are formed on the surfaces of cavities 40 and 42, respectively. Thin oxide layer 50 is formed on the left edges of semiconductor layers 16, 18, 20, 22 and 24 and thin oxide layer 56 is formed on the right edges of semiconductor layers 16, 18, 20, 22 and 24. It should be understood that when viewed in perspective form, the thin oxide layers 50, 52, 54 and 56 are a continuous single oxide layer. There will be minimal variation in the thickness of the oxide layer over semiconductor layers of differing materials. The thin oxide layer within the cavities 40 and 42 functions as a gate dielectric. The thin oxide layer will also function as an etch stop layer in a subsequent processing step described below. In one form, the oxide layer is thermally grown and is silicon dioxide. Other forms of the thin oxide layer may be dielectrics that are deposited, such as oxides, metal oxides or oxy-nitrides.

Figure 9:
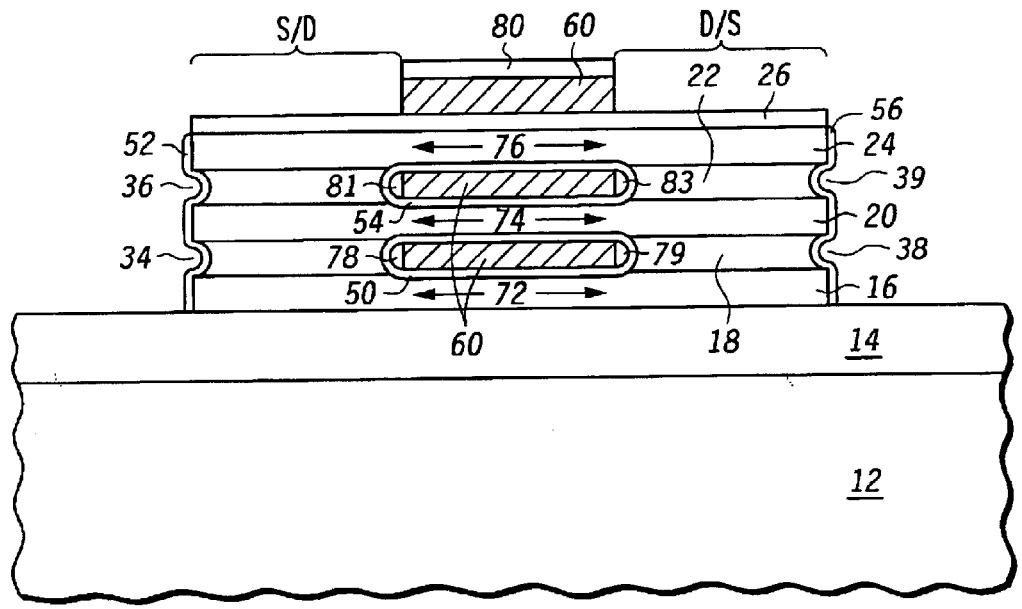
FIG. 9 illustrates in cross-sectional form continuation of the processing of the semiconductor device of FIG. 8 including the formation of multiple overlying channels.

Illustrated in FIG. 9 is further processing of semiconductor device 10 wherein a gate electrode 60 and a masking (i.e. blocking) layer 80 are deposited and patterned to form the illustrated gate. A gate is formed in multiple portions in different vertical layers as noted by the cross-hatching in FIG. 9. The multiple layers of the gate surround the channel regions 72, 74 and 76 and form a vertical stack with respect to a horizontal reference coplanar with a top surface of the substrate 12. In other words, the channel regions 72, 74 and 76 are physically separated at least by portions of a control terminal material used to form gate electrode 60. In one form, gate electrode 60 is either a metal or polysilicon, either in doped or undoped form. Due to the conformal nature of the deposition of polysilicon, the gate electrode forms in each of cavities 40 and 42 and is removed (i.e. etched) conformal to the desired pattern location and etch rate. The etch results in former cavity 40 having an edge cavity 78 and an edge cavity 79. Similarly, former cavity 42 has an edge cavity 81 and an edge cavity 83. These edge cavities are desired and function as spacers isolating the source and drain regions from the gate and will be filled with insulating spacer material to be described below. To the left of the gate electrode 60 is a source or drain region designated as "S/D" and to the right of the gate electrode 60 is a drain or source region designated as "D/S" that function as current handling terminals. Each current handling terminal has a width that is substantially equal to a first value. Each of the channel regions 72, 74 and 76 has a width that is substantially equal to a second value wherein the first value is greater than the second value. At this point in the processing, these source and drain regions are doped with an ion implantation. An N type implant is performed for an NMOS transistor and a P type implant is performed for a PMOS transistor. Masking layer 80 and gate electrode 60 function as blocking layers to prevent the implant from entering the channel regions. It should be noted that a transistor has been formed having multiple channels that are compact and vertically aligned in overlying fashion. The channel dimensions between the various portions of gate electrode 60 may be formed with extremely fine precision because the channels are grown in the vertical direction. This is a very important feature. In multiple gate transistors, the ability to control the dimensions of the transistor channel control other electrical parameters such as leakage current and short channel effects.

At this point, an integrated circuit having a transistor with source, drain and gate electrodes has been formed. The transistor has multiple overlying channel regions formed under or between multiple gate layers. The gate layers are a common material and are represented by the cross-hatched regions, such as the region of gate electrode 60. The gate electrode 60 functions as a control terminal and is shaped to fully loop around channel regions 72, 74 and 76. Alternating layers of the semiconductor layers, such as semiconductor layers 16, 20 and 24 contain a channel region connected to the source and drain on either end. The source and drain have a different conductivity than the channel as a result of source/drain implants. It should be noted that the source/drain that is formed by the ion implantation of semiconductor layers 16, 18, 20, 22 and 24 is formed of a substantially homogenous crystal lattice to have homogenous crystallinity. Similarly, the plurality of channels formed by channel regions 72, 74 and 76 is also formed of a substantially homogenous crystal lattice to have homogenous crystallinity.

Figure 10:
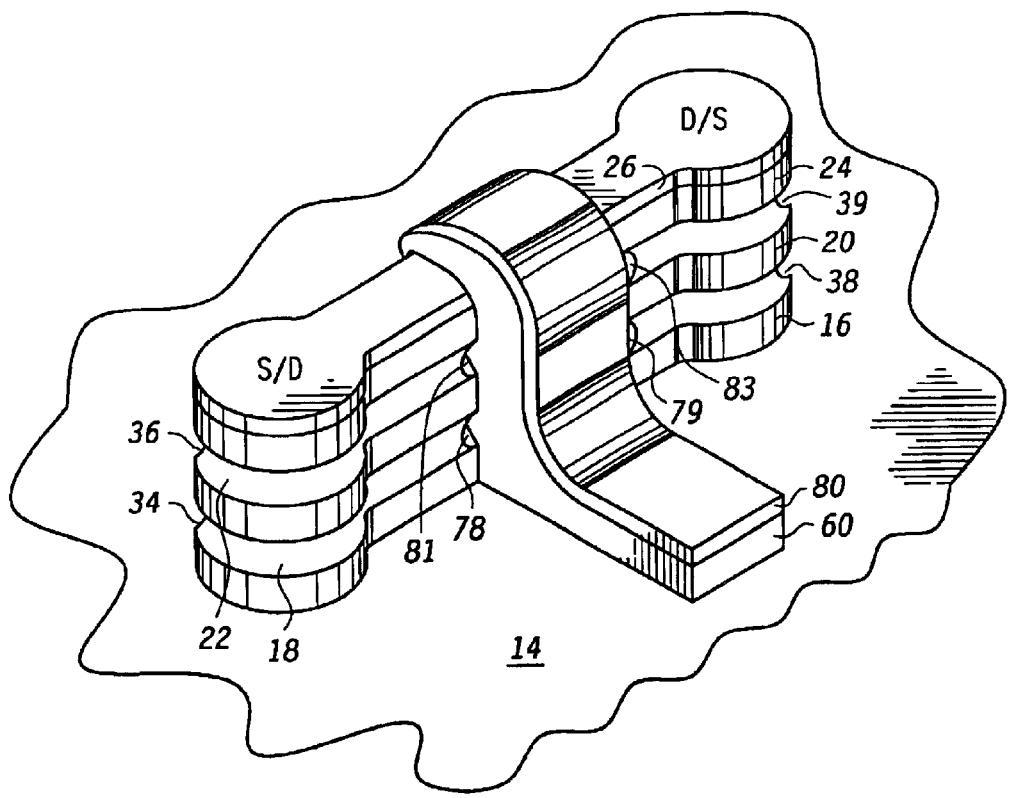
FIG. 10 illustrates in perspective form the semiconductor device illustrated in FIG. 9.

Illustrated in FIG. 10 is a perspective view of the semiconductor device 10 of FIG. 9. For convenience of illustration, the same elements are numbered identically. Again, it should be noted that the shape of the source and drain columns may vary. Although the original shape may begin as a straight-edge structure, the various etching steps tend to round or smooth the source and drain regions resulting in the circular forms. All of the semiconductor layers 18, 20, 22 and 24 are grown from the same seed layer, semiconductor layer 16. This provides substantially monocrystalline channels. Monocrystalline silicon provides better transistor characteristics (e.g. mobility, dopant activation and oxide quality) than polycrystalline or amorphous silicon. Any number of semiconductor layers may be implemented. Additional semiconductor layers create further channel surface area and thus increased transistor drive capability. This additional drive capability is provided without increasing lateral transistor area and is therefore a very compact and size efficient transistor. While the cross-sectional views of the previous illustrations do not lend themselves to show how the gate electrode 60 loops around channel region 74 and channel region 76, it is clear from the perspective view of FIG. 10 that the gate electrode goes through former cavities 40 and 42 to form a loop around channel region 74 and channel region 76. Channel region 72, the lowest or bottom-most channel region has only overlying gate electrode material. It should be noted that the transistor embodied by semiconductor device 10 may be implemented with a plurality of channels, such as channel 16 and channel 20, that vary in thickness and have different thickness rather than a uniform thickness. Since the structure is a stack structure, the various layers can readily be formed with differing thickness. Further, the separation distance between any two of the plurality of channels may be different. In other words, semiconductor layer 18 may be implemented with a thickness that is different than the thickness of semiconductor layer 22. In this form, at least two of the plurality of channels are separated from an adjacent channel by a different amount. The variability in thickness provides flexibility in adjusting the desired transistor characteristics. Additionally, it should be understood that in the FIG. 10 perspective, the gate electrode 60 extends symmetrically from the other side of the transistor that is not visible from the view. In other words, gate electrode 60 is symmetric and extends away from the channel region a predetermined desired amount.

Figure 11:
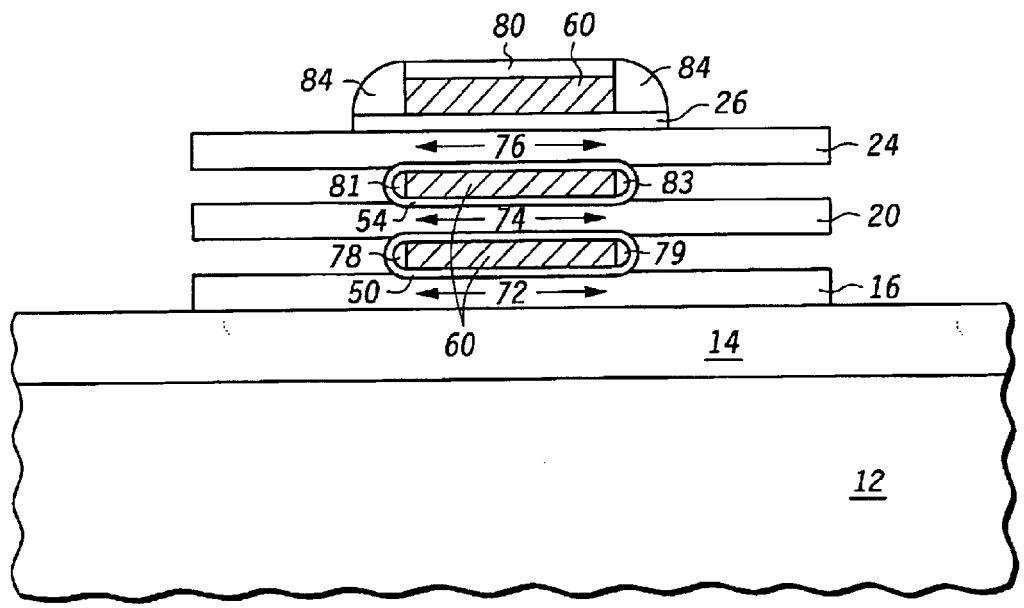
FIG. 11 illustrates in cross-sectional form removal of a portion of layers of the semiconductor device of FIG. 9.

Illustrated in FIG. 11 is a cross-sectional view of semiconductor device after yet further processing from the structure of FIG. 9. A spacer 84 is formed which isolates the gate from the source and drain. At this point part or all of semiconductor layers 18 and 22 are removed by an isotropic etch. If semiconductor layers 18 and 22 are formed of silicon germanium, it may be desirable to remove these layers and re-grow silicon in its place. This step is application specific. In some applications it is desired to remove silicon germanium because the composition may result in a germanicide and silicides on silicon have lower resistivity than germanicides. In other applications, dopant activation properties of germanium may be desirable and therefore the presence of silicon germanium is desired. This etch also removes the thin oxide layers 52 and 56. The semiconductor layers 20 and 24 are suspended at the sides but anchored by the gate and channel structure.

Figure 12:
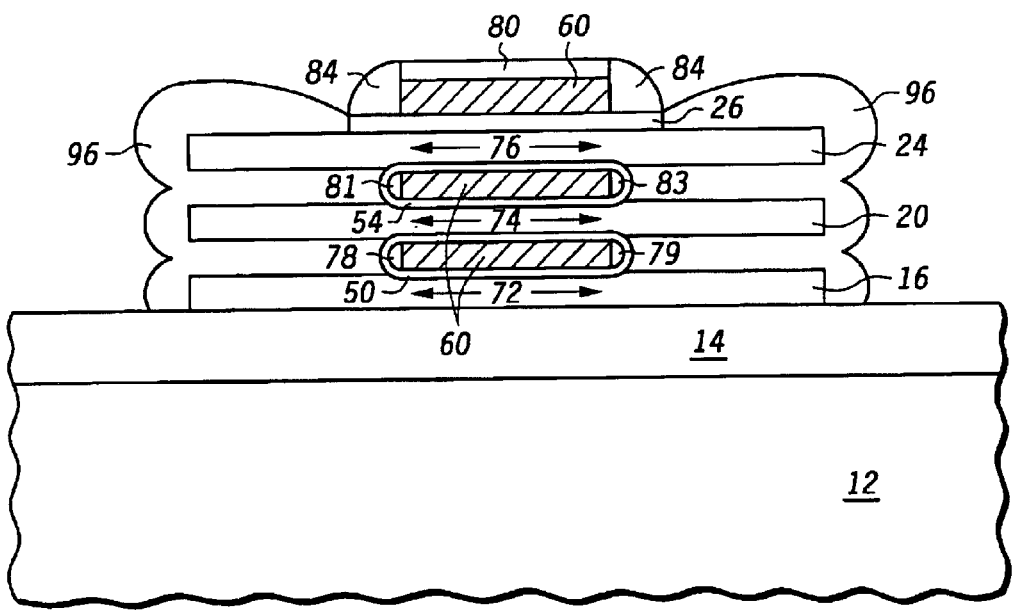
FIG. 12 illustrates in cross-sectional form completion of the semiconductor device.

Illustrated in FIG. 12 is a cross-sectional view of semiconductor device 10 wherein additional semiconductor region 96 is selectively grown, usually epitaxially, on all exposed silicon or silicon germanium regions. Semiconductor region 96 functions to reduce the resistance of the source and drain regions of the transistor formed by semiconductor device 10. Semiconductor region 96 also functions as a continuous contact region to the source and drain of the structure. It should be understood that further conventional processing may be implemented such as additional source/ drain implanting, thermal activation, salicidation of the source, drain and gate regions and contact structure formation and metal interconnect.

By now it should be appreciated that there has been provided a field effect transistor in an integrated circuit and method of formation that has multiple channel regions that are overlying in an efficient vertical stack structure. The transistor has multiple layers of silicon and gate electrodes and gate dielectric in the channel region. Channel region is increased for a given layout area as compared with conventional multiple channel or multiple fin transistor structures. The increased channel area increases the current drive of the transistor and the control of the channel dimensions contribute to better short channel performance and manufacturability of the transistor. In one form, an integrated circuit has a substrate and an overlying transistor. The structures taught herein provide an efficient method to control the channel dimensions. Further the separation distance between portions of a same channel may vary and the separation distance between channels of differing transistors may be different or the same depending upon the specific desired application. The transistor has a first channel overlying the substrate, a first portion of a control or gate electrode overlying the first channel, a second channel overlying the first portion of the gate electrode and a second portion of the gate electrode overlying the second channel and connected to the first portion of the gate electrode. A first current handling electrode is connected to the first channel and the second channel. A second current handling electrode is connected to the first channel and the second channel. The method of fabricating a vertical multiple-channel FET device provides an integrated circuit substrate. At least two layers having a first composition with a first etch property overlie the substrate. At least one layer of a second composition having a second etch property also overlie the substrate and alternate with the at least two layers of the first composition. The at least two layers of the first composition and the at least one layer of the second composition are formed to have a substantially homogenous crystallinity. A blocking layer is formed over the at least two layers of the first composition and the at least one layer of the second composition. The blocking layer is patterned to define placement of a first current electrode region, a second current electrode region and a plurality of channels. Exposed portions of the at least two layers of the first composition and the at least one layer of the second composition are etched to form the first current electrode region, the second current electrode region and channel regions extending from the integrated circuit substrate. The at least one layer of the second composition is further etched to remove said at least one layer of the second composition and to form the plurality of channels of the first composition and located above and below any removed portion of the at least one layer of the second composition. A control electrode dielectric is deposited around each of the plurality of channels. Control electrode material is deposited around the control electrode dielectric. The control electrode material is selectively masked and etched to form a control electrode on top, bottom and sidewall surfaces of at least one of the plurality of channels. A spacer is formed to isolate the control electrode material from the first current electrode region and the second current electrode region.

Although the method and structure taught herein has been disclosed with respect to certain specific steps and materials, it should be readily apparent that various alternatives may be used. Source and drain electrodes may be used with polysilicon material instead of substantially monocrystaline silicon. Gate dielectrics other than silicon dioxide may be used. The height of the gate structure, including specific component elements, may be varied significantly. The gate length may be varied depending upon the specific channel length desired for an application. The gate material may be polysilicon that is insitu doped or implanted, polysilicon germanium or metals such as titanium nitride, tantalum silicon nitride or silicides such as nickel or cobalt silicides or combinations therein. Although the width of the source and drain is illustrated to be greater than the width of each of the channels, the widths could be substantially the same.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of fabricating a vertical multiple-channel FET device comprising:

providing an integrated circuit substrate;

providing at least two layers of a first composition having a first etch property;

providing at least one layer of a second composition having a second etch property, wherein the at least two layers of the first composition and the at least one layer of the second composition are formed to have a substantially homogenous crystallinity and wherein the at least two layers of the first composition are separated by the at least one layer of the second composition;

forming a blocking layer over the at least two layers of the first composition and the at least one layer of the second composition;

patterning the blocking layer to define placement of a first current electrode region, a second current electrode region and a plurality of channels;

etching exposed portions of the at least two layers of the first composition and the at least one layer of the second composition to form the first current electrode region, the second current electrode region and channel regions extending from the integrated circuit substrate;

further etching the at least one layer of the second composition to remove said at least one layer of the second composition and form the plurality of channels comprised of the first composition and located above and below any removed portion of the at least one layer of the second composition;

depositing a control electrode dielectric around each of the plurality of channels;

depositing control electrode material around the control electrode dielectric;

selectively masking and etching the control electrode material to form a control electrode on top, bottom and sidewall surfaces of at least one of the plurality of channels; and forming a spacer to isolate the control electrode material from the first current electrode region and the second current electrode region.

2. The method of claim 1 wherein providing the at least two layers of a first composition having a first etch property comprises forming the at least two layers of the first composition by epitaxially growing the at least two layers of the first composition.

3. The method of claim 1 further comprising:
forming additional material overlying areas adjacent the control electrode and the spacer to reduce resistance of the first current electrode region and the second current electrode region of the vertical multiple-channel FET device.

4. The method of claim 1 further comprising:
etching the at least one layer of the second composition at the first current electrode region and the second current electrode region; and
forming additional material at areas not covered by the control electrode and the spacer to reduce resistance of the first current electrode region and the second current electrode region of the vertical multiple-channel FET device.

5. The method of claim 1 further comprising selecting composition of the integrated circuit substrate to be one of the group consisting of silicon, silicon on insulator, silicon on sapphire, and silicon on nitride.

6. The method of claim 1 further comprising forming the integrated circuit substrate as a plurality of layers, one of the plurality of layers of the integrated circuit substrate having the first composition.

7. The method of claim 1 further comprising providing the integrated circuit substrate as a silicon-on-insulator (SOI) bonded wafer having a silicon layer which functions as one of the at least two layers of the first composition.

8. The method of claim 1 further comprising providing the at least two layers of a first composition and the at least one layer of a second composition by using at least one of the group of processes consisting of epitaxial growth, atomic layer deposition, and molecular beam epitaxy.

9. The method of claim 1 further comprising selecting the first composition from one of the group consisting of silicon, germanium, silicon germanium and silicon germanium carbon and selecting the second composition from one of silicon, germanium, silicon germanium and silicon germanium carbon.

10. The method of claim 1 further comprising selecting the first composition from one of the group consisting of gallium arsenide, gallium nitride and indium phosphide, and selecting the second composition from one of the group consisting of gallium arsenide, gallium nitride and indium phosphide.

11. The method of claim 1 further comprising forming the blocking layer from one of the group consisting of photoresist, nitride, oxide, and organic anti-reflective coating.

12. The method of claim 1 wherein the further etching of the at least one layer of the second composition to remove said at least one layer of the second composition and form the plurality of channels further comprises etching to create a height of each of the plurality of channels to be less than a length of the control electrode.

13. The method of claim 1 further comprising:
blocking the control electrode by using a blocking layer before etching the at least one layer of the second composition to remove the at least one layer of the second composition at least at the plurality of channels.

* * * * *